(12) United States Patent
Roberts et al.

(10) Patent No.: US 6,405,022 B1
(45) Date of Patent: Jun. 11, 2002

(54) APPARATUS FOR RADIO FREQUENCY PROCESSING WITH SINGLE OSCILLATOR FOR INTERMEDIATE FREQUENCY PROCESSING

(75) Inventors: Richard D. Roberts; Brent A. Myers, both of Palm Bay, FL (US); James C. Richards, Fairfax, VA (US); Eric C. Black, Mountain View, CA (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/572,417

(22) Filed: May 17, 2000

(51) Int. Cl.$^7$ .................................................. H04B 1/40
(52) U.S. Cl. ........................................ 455/76; 455/86
(58) Field of Search .............................. 455/76, 78, 86, 455/83–85, 552, 553, 180.3, 189.1, 260, 118, 119, 75; 375/219, 221

(56) References Cited

U.S. PATENT DOCUMENTS

| | | | |
|---|---|---|---|
| 5,093,636 A | 3/1992 | Higgins, Jr. et al. | 332/100 |
| 5,111,162 A | 5/1992 | Hietala et al. | 332/127 |
| 5,313,173 A | 5/1994 | Lampe | 332/103 |
| 5,325,075 A | 6/1994 | Rapeli | 332/103 |
| 5,424,688 A | 6/1995 | Phillips | 331/16 |
| 5,491,457 A | 2/1996 | Feher | 332/103 |
| 5,784,402 A | 7/1998 | Feher | 375/200 |
| 5,802,463 A | 9/1998 | Zuckerman | 455/208 |
| 5,828,955 A | 10/1998 | Lipowski et al. | 455/324 |
| 5,890,051 A * | 3/1999 | Schlang et al. | 455/76 |
| 5,960,364 A | 9/1999 | Dent | 455/552 |
| 6,016,080 A | 1/2000 | Zuta et al. | 331/25 |
| 6,208,875 B1 * | 3/2001 | Damgaard et al. | 455/552 |
| 6,256,511 B1 * | 7/2001 | Brown et al. | 455/552 |
| 6,259,895 B1 * | 7/2001 | Yoshikawa et al. | 455/73 |

FOREIGN PATENT DOCUMENTS

| | | | |
|---|---|---|---|
| EP | 0 541 305 A1 | 5/1993 | H03D/7/16 |
| EP | 0 678 974 A2 | 10/1995 | H03D/7/16 |
| JP | 403296318 A * | 12/1991 | H03J/7/06 |

* cited by examiner

*Primary Examiner*—Vivian Chin
*Assistant Examiner*—Duc Nguyen
(74) *Attorney, Agent, or Firm*—Allen, Dyer, Doppelt, Milbrath & Gilchrist, P.A.

(57) ABSTRACT

A radio frequency transceiver includes a radio frequency processor having a modulator/demodulator phase locked loop circuit for generating a second intermediate frequency signal. A heterodyne frequency translation loop circuit receives the second intermediate frequency signal and outputs a first intermediate frequency signal. A transmit mixer receives the first intermediate frequency signal and outputs a transmit radio frequency signal fo. A synthesizer circuit is operatively connected to the transmit mixer and the heterodyne frequency translation loop circuit for generating an oscillation signal to the transmit mixer and the heterodyne frequency translation loop circuit. The oscillation signal is divided down by factor N before passing into the heterodyne frequency translation loop circuit.

38 Claims, 3 Drawing Sheets

APPARATUS FOR RADIO FREQUENCY PROCESSING WITH SINGLE OSCILLATOR FOR INTERMEDIATE FREQUENCY PROCESSING

FIELD OF THE INVENTION

This invention relates to radio frequency processing, and more particularly, this invention relates to radio frequency processing with phase lock looped circuits.

BACKGROUND OF THE INVENTION

The use of wireless conductivity devices are becoming more commonplace in industry. For example, cellular networks are prevalent throughout the world. Also, wireless local area networks are becoming increasingly popular in certain areas. Many of these wireless applications use frequencies that exist within the frequency bands that do not require a site license from the Federal Communications Commission. An example of such a band exists at around 2.4 GHz, an unlicensed application space established by the FCC.

One wireless application is a wireless cable replacement. For example, a wireless cable replacement would allow a computer keyboard to connect to a computer without the use of physical wires. It would be similar to an infrared application, but instead use radio frequencies, instead of light.

However, it is difficult to operate at the higher GHz frequencies using small monolithic circuits. The higher frequencies typically require separate chips and circuits. It would be desirable if a majority of a transceiver radio frequency processor could be incorporated monolithically and a simple design could be implemented that would allow a smaller number of components. This would be beneficial in the processing of intermediate frequencies that would be processed in such a system.

SUMMARY OF THE INVENTION

In accordance with the present invention, an apparatus for radio frequency processing includes a local oscillator synthesizer circuit having a voltage controlled oscillator that generates an oscillator signal f1. A divide-by-N circuit receives the oscillator signal f1 and generates an f1/N oscillator signal. A receiver circuit and transmitter circuit are operatively connected to the local oscillator synthesizer circuit for respectively down converting/up converting radio frequency signals. The transmitter circuit includes a heterodyne frequency translation loop circuit and receives the f1/N oscillator signal in a mixer that receives the oscillator signal. A receiver circuit includes a first mixer for receiving a radio frequency signal. The oscillator signal and a quadrature image reject mixing circuit receive the f1/N oscillator signal.

A modulator/demodulator phase locked loop circuit is connected to the transmit and receive circuit and demodulates and modulates radio frequency signals. A transmit/receiver switch is operatively connected to the receiver circuit and the modulator/demodulator phase locked loop circuit for switching between a transmit and receive mode of operation. The heterodyne frequency translation loop circuit further comprises a phase detector, voltage controlled oscillator and a mixer that receives the f1/N oscillator signal.

The apparatus for radio frequency processing of the present invention in another aspect includes a modulator/demodulator phase locked loop circuit for generating a second intermediate frequency signal having a frequency of about f3. A heterodyne frequency translation loop circuit receives the first intermediate frequency signal and outputs a first intermediate frequency signal having a frequency of f2. A transmit mixer receives the first intermediate frequency signal and outputs a transmit radio frequency signal having a frequency fo. A synthesizer circuit is operatively coupled to the transmit mixer and the heterodyne frequency translation loop circuit and generates an oscillation signal having a frequency f1 to the transmit mixer and the heterodyne frequency translation loop circuit. This oscillation signal is divided down by a factor N before passing into the heterodyne frequency translation loop circuit.

In another aspect of the present invention, the modulator/demodulator, heterodyne frequency translation loop circuit and transmit mixer are monolithically formed. In yet another aspect of the present invention, the synthesizer circuit comprises a frequency hopping local oscillator synthesizer circuit having a phase detector and voltage controlled oscillator in loop with the phase detector. A reference signal generator is operatively connected to the phase detector of the frequency hopping local oscillator circuit for generating a reference signal $\Delta Fo/(1+1/N)$ to the phase detector.

The modulator/demodulator phase locked loop circuit also includes a phase detector, voltage controlled oscillator and a summing circuit operatively connected to the phase detector and the voltage controlled oscillator. The modulator/demodulator phase locked loop circuit also includes a transmit/receive switch for switching between a transmit function for receiving transmit data within the summing circuit and a receive function where no transmit data is received. In yet another aspect of the present invention, a high pass filter receives the transmit radio frequency signal and has a cut-off frequency (f1−f2). The transmit radio frequency signal is a GFSK modulated signal of about 2.4 GHz in the ISM band.

In yet another aspect of the present invention, a first receive mixer receives a radio frequency signal and a transmit/receive switch is operatively connected to the first receive mixer and the transmit mixer for switching between the first receive mixer for a receiver function and the second transmit mixer for a transmitter function. A second receive mixer circuit has a quadrature image reject mixing circuit operative with sine and cosine signal components. The first receive mixer and image reject mixing circuit are operatively connected to the synthesizer circuit for receiving the oscillation signal. This oscillation signal is divided down by a factor N before the image reject mixing circuit. A transmit/receive switch is operatively connected to the second receive mixer circuit and the modulator/demodulator phased lock loop circuit for switching between a transmit function where a reference signal is received within the modulator/demodulator phase locked loop circuit and the receive function where the second receive mixer circuit is operatively connected to the modulator/demodulator phase lock loop circuit.

The quadrature function image reject mixing circuit includes mixers operative with sine and cosine signal components. The modulator/demodulator phase locked loop circuit, heterodyne frequency translation loop circuit, first receive mixer, second receive mixer circuit and transmit mixer are monolithically formed.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The apparatus of the present invention forms a radio frequency processor and is used in a radio frequency transceiver. It generates a frequency hopping spread spectrum (FHSS) GFSK, frequency shift keyed, modulated signal in the 2.4 GHz ISM band, and receives and demodulates a frequency hopping spread spectrum GFSK modulated signal within the same 2.4 GHz ISM band. In one advantageous aspect of the present invention, the frequency hopping local oscillator is common to two respective mixing circuits of each of the transmitter and receiver circuits. Most of the transmitter and receiver components are monolithically formed an one chip, including major portions of the transmitter modulator and receiver demodulator circuits. One off-chip voltage controlled oscillator (VCO) has dual conversion, where first and second linear oscillators are harmonically related by a factor "N". Additional voltage controlled oscillators are used to form respective first and second intermediate frequencies (f2 and f3), but these voltage controlled oscillators operate in a frequency range that can be implemented at lower frequencies with on-chip techniques and are less complex.

In the transmitter circuit, frequency translation occurs between the second intermediate frequency (f3) and the first intermediate frequency (f2), as opposed to frequency multiplication, which prevents excessive phase noise amplification. An additional constraint in the receiver is a requirement to provide a low enough first intermediate frequency (f2) that requires image reject mixing techniques to be feasible. Although many aspects of dual conversion are known to those skilled in the art, the system approach to modulation and demodulation of the frequency shift keyed (FSK) signal has several desirable features, including an off-chip frequency hopping VCO that is used for both the transmitter and receiver circuits and facilitates a dual conversion process. It also provides a reference signal for both first and second frequency conversions. A transmitter frequency translation, i.e., up conversion occurs from a second intermediate frequency (f3) to a first intermediate frequency (f2) to prevent phase noise multiplication associated with frequency multiplication. The first intermediate frequency (f2) is low enough to reduce complexity. Receiver image reject mixer techniques from the first intermediate frequency (f2) to the down converted second intermediate frequency (f3) circumvent second intermediate frequency image responses.

The second intermediate frequency (f3) is also low enough to facilitate accurate FSK/GFSK four-level modulation and demodulation with the same phase locked loop (PLL). The first intermediate frequency (f2) is also high enough to afford good first intermediate frequency image rejection in both the receiver and transmitter for simple radio frequency prefiltering, while still allowing the advantages as described above.

Figure 1:
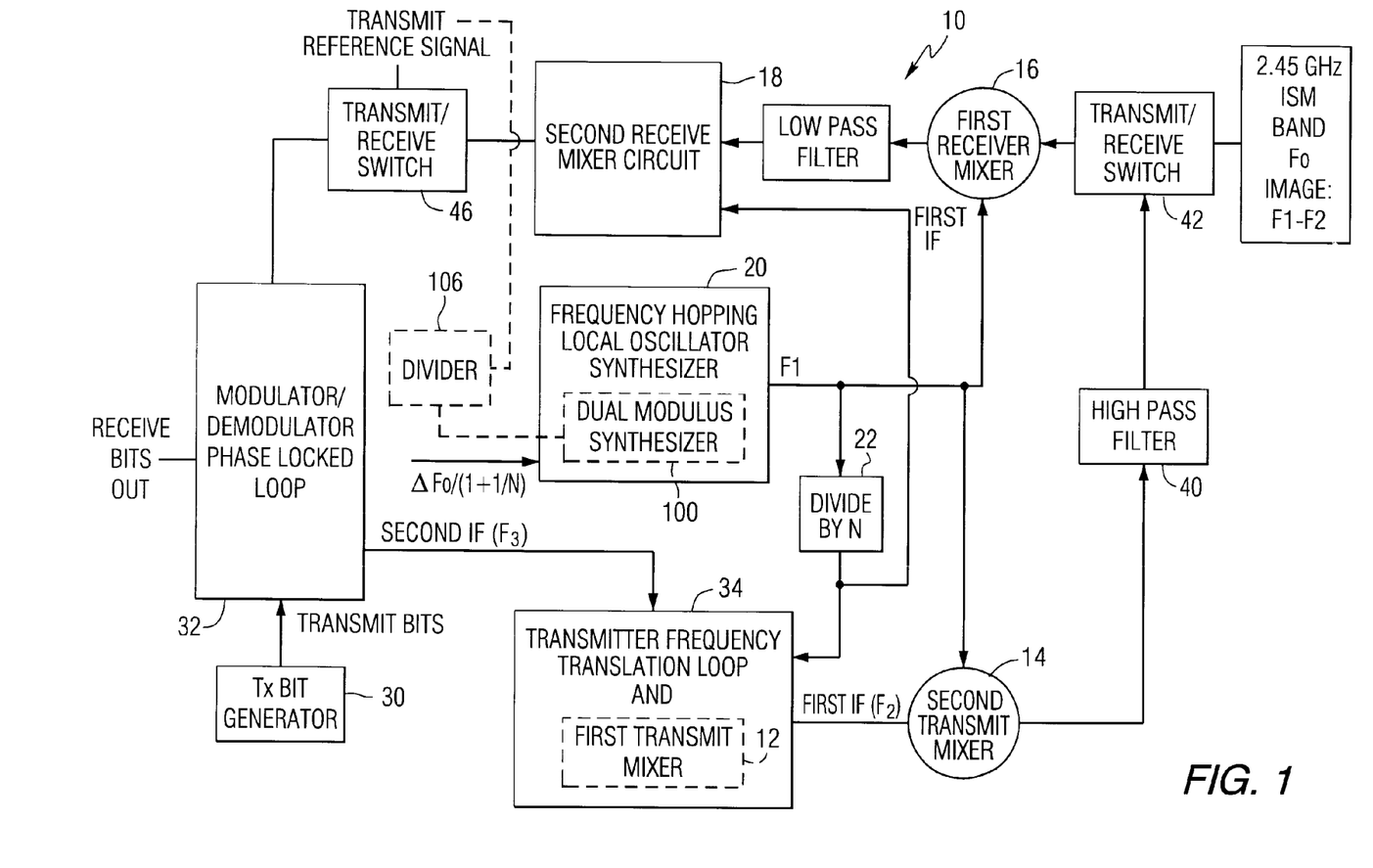
FIG. 1 is a high level block diagram showing basic components of the apparatus of the present invention formed as a radio frequency processor.

Referring now to FIG. 1, there is illustrated a basic block diagram showing high level components of a radio frequency processor 10 used in a communication transceiver for the 2.45 GHz ISM band. Although the described frequencies will be chosen for final operation at the 2.45 GHz ISM band, the described frequencies are only representative of one type of selection of final frequencies at which the radio frequency processor of the present invention can be used. However, the description as follows is pertinent to the higher 2.45 GHz frequency area in the ISM band as described.

In the present invention, there are two transmit mixers, referred to as a first transmit mixer 12 and second transmit mixer 14, and a first receive mixer 16 and second receive image reject mixer circuit 18, which in prior art techniques, would require two local oscillators, one local oscillator for a first transmit and receive mixer, and a second local oscillator for a second transmit and receive mixer.

Figure 2:
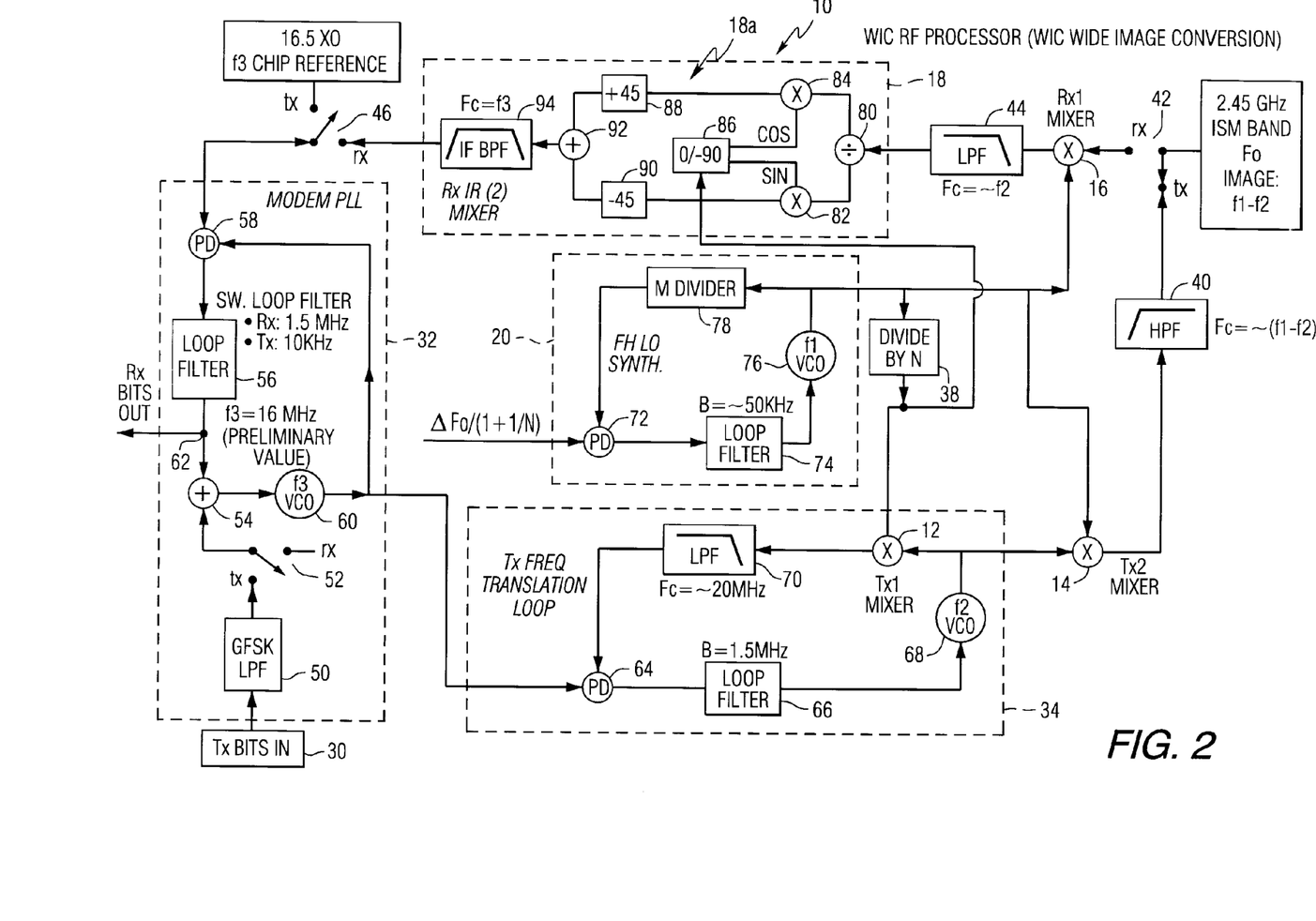
FIG. 2 is a more detailed block diagram of the apparatus shown in FIG. 1.

In the radio frequency processor 10 of the present invention, shown in FIGS. 1 and 2, there is only one oscillator, referred to by the frequency hopping local oscillator synthesizer 20, generating an oscillator signal at frequency f1 to first mixers and into a divider 22 circuit and into the second mixers. A description of the basic components of the invention follows with a brief description of the mathematics operable for the present invention. The transmitter circuits will be first described, followed by the receiver circuits.

Transmit bits are generated via transmitter generator 30 and forwarded into the modulator/demodulator phase locked loop circuit 32. A signal is passed into a transmitter frequency translation loop 34 and then into the first transmit mixer 12. An oscillator signal is generated from the frequency hopping local oscillator synthesizer 20, which has generated its signal through a divide by N circuit 38 into the transmitter frequency translation loop 34 and first transmit mixer 12 to be mixed therein to formulate the first intermediate frequency f2 signal. This signal is mixed at the second transmit mixer 14, which receives the oscillator signal from the frequency hopping local oscillator synthesizer 20 without passing through the divide by N circuit 22. It outputs via high pass filter 40 the ISM band frequency Fo that is an image of the f1–f2. A cut-off frequency Fo exists in the high pass filter 40. The signal then passes into a transmit/receive switch 42 at the desired frequency.

On the receiver circuit side, the modulated radio frequency signal, i.e., a frequency hopping signal in one aspect of the invention, enters the transmit/receive switch 42, which has been switched to the receiver circuit side. The signal enters the first receive mixer 16 that receives the oscillated signal f1 from the frequency hopping local oscillator synthesizer 20. An intermediate frequency f2 signal is output into a low pass filter 44. Within the second receiver image reject mixer circuit 18, having sine/cosine signal wave component quadrature mixing circuits explained below, the second intermediate frequency f3 signal is generated into a transmit/receive switch 46 to pass the signal into the modulator/demodulator phase locked loop 32 where the receive bits pass and are forwarded therefrom.

All components as described, with the exception of the higher frequency, frequency hopping local oscillator synthesizer 20, and can be formed monolithically with the frequency ranges in operation, as will be described.

For purposes of description, selected components of the block components shown in FIG. 1 are now described with reference to the one preferred embodiment of the circuit shown in FIG. 2.

As shown in FIG. 2, the transmit/receive switch 46 allows switching between the transmit reference signal and the second intermediate frequency f3 received from the second receiver mixer 18. The modulator/demodulator phase locked loop 32 includes a GFSK low pass filter 50 that receives the generated transmit bits from the transmitter bit generator 30. These bits pass from the low pass filter 50 through a phase locked loop transmit/receive switch 52 that is in the transmit switch mode. The signal passes into a modem phase lock loop summing circuit 54 that has received the signal from a loop filter and phase detector 58. This loop includes a voltage controlled oscillator 60 that loops back into the phase detector 58. The loop filter 56 has a receiver operability of 1.5 MHz and a transmitter operability of 10 KHz. As described before, the receiver bits are forwarded out at a receiver connection 62 that exists between the loop filter 56 and the modem phase lock loop summer 54.

On the transmitter circuit side, the second intermediate frequency f3 signal passes into the transmitter frequency translation loop 34 and initially enters a phase detector 64 and a loop filter 66, whose bandwidth is about 1.5 MHz, and into a voltage controlled oscillator 68. In one aspect of the present invention, the voltage controlled oscillator 68 is at about 280 MHz. This circuit loop includes the first transmit mixer 12 and a low pass filter 70 where the cut-off frequency fc is about 20 MHz. The first transmit mixer 12 receives the local oscillator signal from the frequency hopping local oscillator synthesizer through the divide by N circuit 38. The generated and upconverted first intermediate frequency f2 signal enters the second transmit mixer that has received the local oscillator signal from the frequency hopping local oscillator synthesizer 20, without having passed through the divide by N circuit 22. The resultant up converted radio frequency signal as the desired modulated radio frequency signal passes into the high pass filter 40 and through the transmit/receive switch 42 when it is switched on in the transmit mode.

The frequency hopping local oscillator synthesizer 20 includes a phase detector 72 that receives a reference signal with a frequency $\Delta F0/(1+1/N)$ and a loop filter 74 where B (bandwidth) is approximately 50 KHz, and an off-chip voltage controlled oscillator 76 of frequency f1, and an M divider 78 circuit in the loop. The M divider is operable with N divider as known to those skilled in the art.

The second receiver image receive mixer circuit includes the quadrature mixing circuit 18a, and includes a signal splitter circuit 80 with respective cosine and sine mixer circuits 82,84 for the quadrature that are operative with a 0/−90° phase circuit 86. Respective cosine and sine mixers feed respective +45 and −45 shifter circuits 88,90 that pass the signal into a summing circuit 92 and into an intermediate frequency bandpass filter 94, having a center frequency Fc equal to f3 and a bandwidth sufficient to pass the modulated signal, which is about 1 MHz in this example.

The off-chip oscillator VCO 76 is embedded in a relatively narrow loop and requires good phase noise. Because of its higher frequency, it is typically formed off-chip. The on-chip VCO 60 would require about 5% accuracy and an RC network off-chip, if necessary. The voltage controlled oscillator 68 is an on-chip oscillator, embedded in the wide phase locked loop, and tolerates poor phase noise because it works in a heterodyne manner and is not a frequency multiplier. It is still frequency modulated, and residual noise would not be amplified. The loop filter 66 drives the VCO 68 through the proper instantaneous frequency and with the loop, an error signal is formed. The actual frequency that is generated from the second transmit mixer 14 is one of 80–100 frequencies that are in the ISM band as desired, as known to those skilled in the art. The frequencies could be stepped within their band, as in 1 MHz steps.

In the receive mode of operation, the signal passing from the low pass filter 44 has a cut-off frequency Fc at the f2 frequency, about 287 MHz. The second receive mixer acts in an image reject down conversion process to down convert the modulated radio signal from 287 MHz down to about 16 MHz.

The various ranges of the frequencies and divide by N number for FIG. 2 can be represented as:

Fo=f3+f1*(1+1/N)
$\Delta$f1=$\Delta$Fo/(1+1/N)
N=(Fo−f2)/(f2−f3)
f2=(f3+Fo/N)/(1+1/N)
f1=Fo−f2

Figure 3:
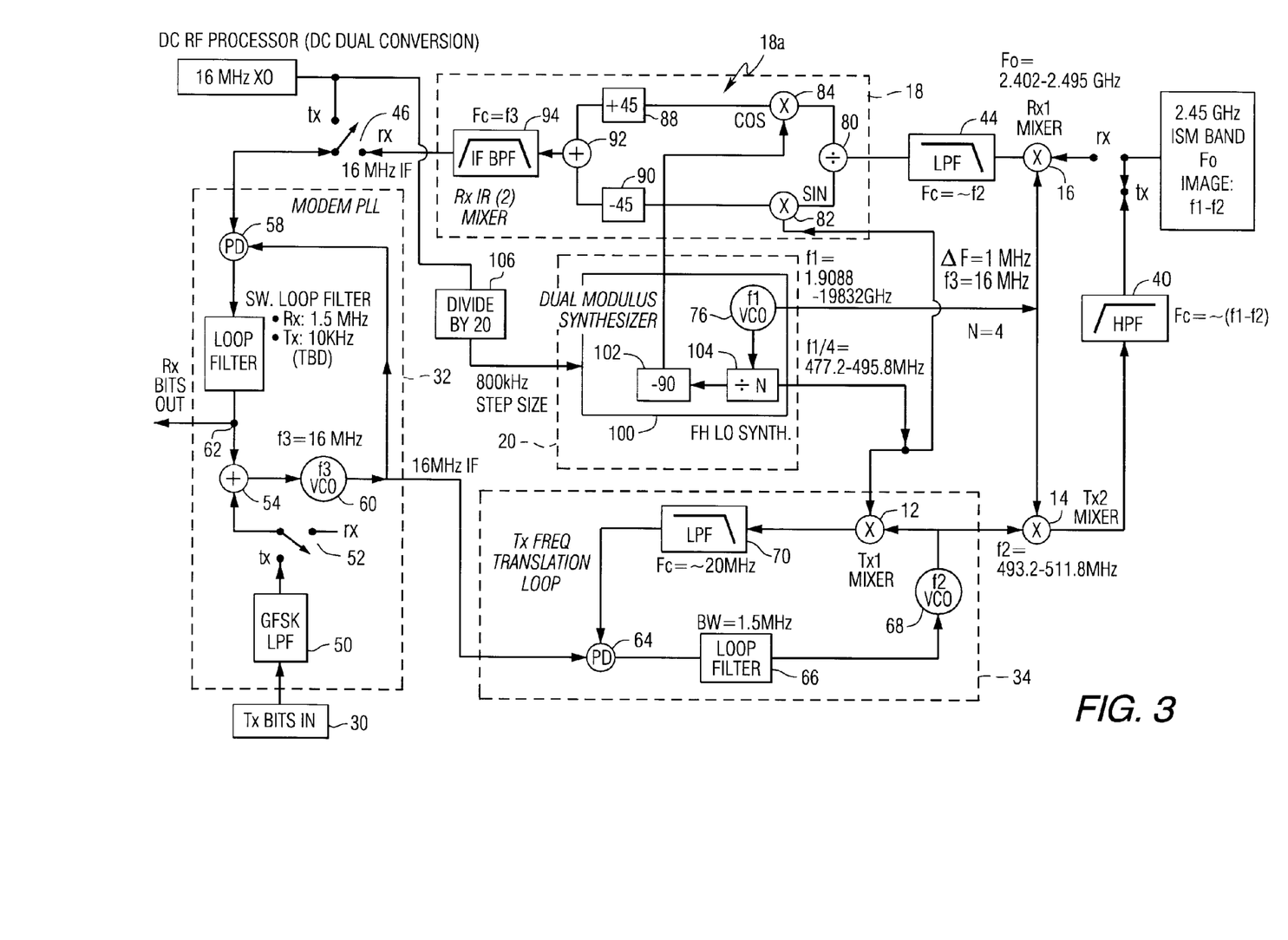
FIG. 3 is another embodiment of the apparatus of FIG. 1 showing a modified frequency hopping local oscillator synthesizer and second receive mixer circuit.

Example (based upon FIG. 3):

N=4, Fo=2.45 GHz, $\Delta$Fo=1 MHz, f3=16.0 MHz then f2=502.8 MHz, f1=1.9472 GHz, $\Delta$f1=800 kHz (synthesizer reference)

Basic mathematics substantially supporting the embodiment shown in FIGS. 1 and 2 are set forth below.

$BTC_\epsilon BTC\{0,1 \ldots 93\}$ (BTC Blue Tooth Channel)
Fo=BTC*1 MHz+2.402 GHz where Fo is the frequency within "2.402–2.495 band" (A merger of USA and JAPAN RF Channels)

Receiver Tuned Frequency: $Fo_{receiver}$=f3+f1/N+f1=f1(1+1/N)+f3
Transmitter Tuned Frequency: $Fo_{transmitter}$=f1+f2 where f2=f3+f1/N
so $Fo_{transmitter}$=f1(1+1/N)+f3

Conclusion: $Fo_{receiver}$=$Fo_{transmitter}$=Fo

The concluding equation means RX and TX are both tuned to same frequency given f1, f3 and N.

Useful Relationships . . .

Synthesizer Step Size (Reference Frequency):
dFo=f3+(f1−df1)(1+1/N)−f3−f1(1+1/N)=df1(1+1/N) hence df1=dFo/(1+1/N)–step size–

Value of f2 given a value of N: f2=f3+f1/N=f3+(Fo−f2)/N–> solving yields–>f2={N*f3+Fo}/{1+N}

Value of N given f2 frequency: N={Fo−f2}/{f2−f3}

Image Frequency: f1−f2
IF frequency: f2

Synthesizer frequency selection equations:
  f1=M*(dFo)/(1+1/N)
  M=2402+BTC−f3 (units MHz)

The dual conversion synthesizer forming the frequency hopping local oscillator synthesizer maintains a specified radio frequency step side with a divide by N operation. The canonic programmable frequency synthesizer has a reference equal to the output step size, $\Delta$Fo. Dual conversion with divide by N changes the reference frequency to $\Delta Fo/(1+1/N)$. The step size seen by the up conversion in the Tx and down conversion in the Rx, however, is still $\Delta Fo$. The basic mathematics to show this fact are:

f1 VCO output: $\Delta Fo/(1+1/N)$
divide by N output: $\Delta Fo/((1+1/N)*N)$

The above frequency steps are summed by dual conversion. The sum of these partial step sizes is shown below:

$\Delta Fo/(1+1/N)+\Delta Fo/((1+1/N)*N)$
$\Delta Fo*N/((1+1/N)*N)+\Delta Fo/((1+1/N)*N)$
$(\Delta Fo*N+\Delta Fo)/((1+1/N)*N)$
$\Delta Fo*(N+1)/(N+1)$
$\Delta Fo$ The above mathematical steps show dual conversion with divide by N maintains the step size seen by the up and down conversions. Dual conversion can be combined with other operations (e.g., multiply by N).

An example is shown in FIG. 3, where similar elements shown in FIGS. 1 and 2 are given the same reference numerals.

The frequency hopping local oscillator synthesizer has a dual modulus synthesizer circuit 100 that includes a –90 phase circuit 102, the f1 VCO 76, and a divide by N circuit 104, which is configured by a divide by 4, or N=4. The dual modulus synthesizer is fed by a transmit reference signal that has been divided via a divide by 20 circuit 106, which allows 800 KHz steps.

The second receiver mixer circuit 18 includes the sine and cosine mixers 82,84 where the cosine mixer 84 receives a signal from the dual modulus synthesizer 100, and more particularly, the +45 and –45 phase circuits 88,90 receive signals from the sine and cosine mixers 82,84 into the summing circuit 92 and then into the bandpass filter 94 as described before. The 16 MHz reference signal is shown as produced by the reference signal generator. Various statistics are shown below for the radio frequency processor circuit shown in FIG. 3.

$Fo=f3+f1*(1+1/N)$
$\Delta F1=\Delta F/(1+1/N)$
$N=(Fo-f2)/(f2-f3)$
$f2=(f3+Fo/N)/(1+1/N)$
$f1=Fo-f2$ Example: (BTC=48)

$Fo=2.45$ GHz, $dFo=1$ MHz,
$f3=16.5$ MHz then $f2=502.8$ MHz, $f1=1.9472$ GHz,
$df1=800$ kHz (reference)

This application is related to copending patent application entitled, "APPARATUS FOR RADIO FREQUENCY PROCESSING WITH DUAL MODULUS SYNTHESIZER," which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. An apparatus for radio frequency processing comprising:
    a local oscillator synthesizer circuit having a voltage controlled oscillator that generates an oscillator signal f1 and a divide by N circuit for receiving the oscillator signal f1 and generating an f1/N oscillator signal;
    a receiver circuit and transmitter circuit operatively connected to said local oscillator synthesizer circuit for respectively down converting/up converting radio frequency signals;
    said transmitter circuit further comprising a heterodyne frequency translation loop circuit that receives said f1/N oscillator signal and a mixer that receives said oscillator signal; and
    said receiver circuit further comprising a first mixer for receiving a radio frequency signal and said oscillator signal and an image reject mixing circuit for receiving said f1/N oscillator signal.

2. An apparatus according to claim 1, and further comprising a modulator/demodulator phase locked loop circuit connected to said transmit and receive circuits for demodulating and modulating radio frequency signals.

3. An apparatus according to claim 2, and further comprising a transmit/receiver switch operatively connected to said receiver circuit and said modulator/demodulator phase locked loop circuit for switching between a transmit and receive mode of operation.

4. An apparatus according to claim 1, wherein said heterodyne frequency translation loop circuit further comprises a phase detector, voltage controlled oscillator, and a mixer that receives said f1/N oscillator signal.

5. An apparatus according to claim 1, wherein said image reject mixing circuit further comprises a 0/–90 signal shift circuit that receives said f1/N oscillator signal and outputs a sine and cosine signal component.

6. An apparatus according to claim 5, and further comprising sine and cosine mixers that receive respective sine and cosine signal components.

7. An apparatus according to claim 1, wherein said local oscillator synthesizer circuit further comprises a phase detector, voltage controlled oscillator and M divide circuit.

8. An apparatus according to claim 1, wherein said receiver circuit and transmitter circuit are monolithically formed.

9. An apparatus for radio frequency processing comprising:
    a modulator/demodulator phase locked loop circuit for generating an intermediate frequency signal f3;
    a heterodyne frequency translation loop circuit for receiving the intermediate frequency signal f3 and outputting an intermediate frequency signal f2;
    a transmit mixer for receiving the intermediate frequency signal f2 and outputting a transmit radio frequency signal; and
    a synthesizer circuit operatively connected to the transmit mixer and the heterodyne frequency translation loop circuit for generating an oscillation signal f1 to said transmit mixer and said heterodyne frequency translation loop circuit, wherein said oscillation signal f1 is divided down by a factor N before passing into said heterodyne frequency translation loop circuit.

10. An apparatus according to claim 9, wherein said modulator/demodulator, heterodyne frequency translation loop circuit and transmit mixer are monolithically formed.

11. An apparatus according to claim 9, wherein said synthesizer circuit comprises a frequency hopping local oscillator synthesizer circuit having a phase detector and voltage controlled oscillator in loop with the phase detector.

12. An apparatus according to claim 11, wherein said transmit radio frequency signal is of frequency fo, and further comprising a reference signal generator operatively connected to said phase detector circuit for generating a reference signal of about $\Delta fo/(1+1/N)$.

13. An apparatus according to claim 9, wherein said modulator/demodulator phase locked loop circuit comprises a phase detector, voltage controlled oscillator, and a summing circuit operatively coupled with said phase detector and said voltage controlled oscillator.

14. An apparatus according to claim 9, wherein said phase locked loop circuit comprises a transmit/receive switch for switching between a transmit function for receiving transmit data within said summing circuit and a receive function wherein no transmit data is received.

15. An apparatus according to claim 9, and further comprising a high pass filter for receiving said transmit radio frequency signal fo, wherein said cutoff frequency is about (f1–f2).

16. An apparatus according to claim 9, wherein said transmit radio frequency signal comprises an FSK modulated signal.

17. An apparatus for radio frequency processing comprising:
a modulator/demodulator phase locked loop circuit for generating an intermediate frequency signal f3;
a heterodyne frequency translation loop circuit for receiving the intermediate frequency signal f3 and outputting an intermediate frequency signal f2;
a transmit mixer for receiving the intermediate frequency signal f2 and outputting a transmit radio frequency signal;
a synthesizer circuit operatively connected to the transmit mixer and the heterodyne frequency translation loop circuit for generating an oscillation signal to said transmit mixer and said heterodyne frequency translation loop circuit, wherein said oscillation signal is divided down by a factor N before passing into said heterodyne frequency translation loop circuit;
a first receive mixer for receiving a radio frequency signal,
a transmit/receive switch operatively connected to said first receive mixer circuit and said transmit mixer for switching between said first receive mixer circuit and said second transmit mixer;
a second receive mixer circuit connected to said first receive mixer and having an image reject mixing circuit operative with sine and cosine signal components, wherein said first receive mixer circuit and image reject mixing circuit are operatively connected to said synthesizer circuit for receiving said oscillation signal, wherein said oscillation signal is divided down by a factor N before said image reject mixing circuit; and
a transmit/receive switch operatively connected to said second receive mixer circuit and said modulator/demodulator phase locked loop circuit for switching between a transmit function where a transmit reference signal is received within said moculator/demodulator phase locked loop circuit and a receive function where said second receive mixer circuit is operatively connected to said modulator/demodulator phase locked loop circuit.

18. An apparatus according to claim 16, wherein said image reject mixing circuit includes sine and cosine mixers operative with sine and cosine signal components.

19. An apparatus according to claim 16, wherein said modulator/demodulator phase locked loop circuit, heterodyne frequency translation loop circuit, first receive mixer, second receive mixer circuit and transmit mixer are monolithically formed.

20. An apparatus according to claim 16, wherein said synthesizer circuit comprises a phase detector and voltage controlled oscillator in loop with the phase detector.

21. An apparatus according to claim 20, wherein said transmit radio frequency signal is of frequency fo, and further comprising a reference signal generator operatively connected to said phase detector of said synthesizer circuit for generating a reference signal of about $\Delta fo/(1+1/N)$.

22. An apparatus according to claim 16, wherein said modulator/demodulator phase locked loop circuit comprises a phase detector, voltage controlled oscillator, and a summing circuit operatively connected to said phase detector and said voltage controlled oscillator.

23. An apparatus according to claim 16, wherein said phase locked loop circuit comprises a transmit/receive switch for switching between a transmit function for receiving transmit data within said summing circuit and a receive function wherein no transmit data is received.

24. An apparatus according to claim 16, and further comprising a high pass filter for receiving said transmit radio frequency signal Fo, wherein said cutoff frequency is about (f1–f2).

25. An apparatus according to claim 16, wherein said transmit radio frequency circuit comprises an FSK modulated signal.

26. An apparatus according to claim 16, wherein said synthesizer circuit comprises a 90° dual modulus synthesizer circuit and a voltage controlled oscillator.

27. An apparatus according to claim 26, wherein said synthesizer circuit comprises a divide by N circuit.

28. An apparatus according to claim 27, and comprising a divider circuit that receives a transmit reference signal, wherein said divider circuit is operatively connected to said 90° dual modulus synthesizer circuit.

29. A radio frequency processing method comprising the steps of:
generating an intermediate frequency signal f3 within a modulator/demodulator phase locked loop circuit;
receiving the intermediate frequency signal f3 within a heterodyne frequency translation loop circuit and outputting an intermediate frequency signal f2 into a transmit mixer;
outputting a transmit radio frequency signal from the transmit mixer; and
generating an oscillation signal f1 from a synthesizer circuit to the heterodyne frequency translation loop circuit and transmit mixer and dividing down by a factor N the oscillation signal f1 before reaching the heterodyne frequency translation loop circuit.

30. A method according to claim 29, and further comprising the step of forming monolithically the modulator/demodulator phase locked loop circuit, heterodyne frequency translation loop circuit and transmit mixer.

31. A method according to claim 29, wherein the step of generating the oscillation signal f1 comprises the step of generating the oscillation signal within a frequency hopping local oscillator synthesizer circuit having a phase detector and voltage controlled oscillator.

32. A method according to claim 29, and further comprising the step of generating a reference signal fo/(1+1/N) to the phase detector, wherein the transmit radio frequency signal is about frequency fo.

33. A method according to claim 29, and further comprising the step of generating the oscillation signal within a synthesizer circuit having a voltage controlled oscillator and the step of dividing down by a factor N occurs within the synthesizer circuit.

34. A radio frequency processing method comprising the steps of:

in a transmit mode, generating an intermediate frequency signal f3 within a modulator/demodulator phase locked loop circuit;

receiving the intermediate frequency signal f3 within a heterodyne frequency translation loop circuit and outputting an intermediate frequency signal f2 from the heterodyne frequency translation loop circuit into a transmit mixer;

outputting a radio frequency signal from the transmit mixer;

generating an oscillation signal f1 from a synthesizer circuit to the heterodyne frequency translation loop circuit and transmit mixer and dividing down by a factor N the oscillation signal f1 before reaching the heterodyne frequency translation loop circuit; and in a receive mode, receiving a radio frequency signal within a first receive mixer and within a quadrature image reject mixing circuit operative with quadrature signal components; and receiving the oscillation signal from the synthesizer circuit into the first and second receive mixer circuits, wherein the oscillation signal is divided by a factor N before said quadrature image reject mixing.

35. A method according to claim 34, and further comprising the step of forming monolithically the modulator/demodulator phase locked loop circuit, heterodyne frequency translation loop circuit, transmit mixer, and first receive mixer and quadrature mixing circuit.

36. A method according to claim 34, wherein the step of generating the oscillation signal comprises the step of generating the oscillation signal within a frequency hopping local oscillator synthesizer circuit having a phase detector and voltage controlled oscillator.

37. A method according to claim 34, and further comprising the step of generating a reference signal fo/(1+1/N) to the phase detector, wherein the transmit radio frequency signal is a frequency of about fo.

38. A method according to claim 34, and further comprising of generating the oscillation signal within a synthesizer circuit having a voltage controlled oscillator and the step of dividing down by a factor N occurs within the synthesizer circuit.

* * * * *

UNITED STATES PATENT AND TRADEMARK OFFICE
CERTIFICATE OF CORRECTION

PATENT NO.    : 6,405,022 B1
DATED         : June 11, 2002
INVENTOR(S)   : Roberts et al.

It is certified that error appears in the above-identified patent and that said Letters Patent is hereby corrected as shown below:

Column 10,
Lines 4, 12, 19 and 37, in the first line of each claim indicated, delete "Claim 16" and substitute: -- Claim 17 --

Signed and Sealed this

Third Day of December, 2002

JAMES E. ROGAN
*Director of the United States Patent and Trademark Office*

UNITED STATES PATENT AND TRADEMARK OFFICE
CERTIFICATE OF CORRECTION

PATENT NO.    : 6,405,022 B1
DATED         : June 11, 2002
INVENTOR(S)   : Roberts et al.

It is certified that error appears in the above-identified patent and that said Letters Patent is hereby corrected as shown below:

Column 10,
Lines 4, 7, 12, 20, 25, 30, 34 and 37, in the first line of each claim indicated, delete "Claim 16" and substitute: -- Claim 17 --

This certificate supersedes Certificate of Correction issued December 3, 2002.

Signed and Sealed this

Fifteenth Day of April, 2003

JAMES E. ROGAN
*Director of the United States Patent and Trademark Office*